(12) United States Patent
Chen et al.

(10) Patent No.: US 10,149,400 B2
(45) Date of Patent: Dec. 4, 2018

(54) SYMMETRICAL SLED BLIND MATING IN UNSYMMETRICAL CHASSIS PLACEMENT

(71) Applicant: QUANTA COMPUTER INC., Taoyuan (TW)

(72) Inventors: Chao-Jung Chen, Taoyuan (TW); Yaw-Tzorng Tsorng, Taoyuan (TW); Chun Chang, Taoyuan (TW); Hsiao-Tsu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/442,223

(22) Filed: Feb. 24, 2017

(65) Prior Publication Data

US 2018/0249589 A1   Aug. 30, 2018

(51) Int. Cl.
| H05K 7/16 | (2006.01) |
| H05K 7/14 | (2006.01) |
| H05K 7/20 | (2006.01) |
| H01R 12/70 | (2011.01) |
| H01R 12/72 | (2011.01) |

(52) U.S. Cl.
CPC ....... H05K 7/1489 (2013.01); H01R 12/7005 (2013.01); H01R 12/721 (2013.01); H05K 7/1452 (2013.01); H05K 7/1461 (2013.01); H05K 7/1487 (2013.01); H05K 7/20172 (2013.01); H05K 7/20727 (2013.01)

(58) Field of Classification Search
CPC .......................... H05K 7/1489; H05K 7/1487
USPC .......................................... 361/727; 439/247
See application file for complete search history.

(56) References Cited

U.S. PATENT DOCUMENTS

| 5,385,481 A | 1/1995 | Kotyuk | |
| 5,980,291 A * | 11/1999 | Ono | H01R 13/6315 439/247 |
| 6,450,822 B1 | 9/2002 | Eller | |
| 8,231,399 B2 * | 7/2012 | Daubigney | H01R 13/6275 439/247 |
| 8,773,860 B2 * | 7/2014 | Wang | H05K 7/1487 361/725 |

(Continued)

FOREIGN PATENT DOCUMENTS

| TW | 201328543 A1 | 7/2013 |
| TW | I519226 B | 1/2016 |

(Continued)

OTHER PUBLICATIONS

Taiwanese Office Action for Application No. 106121828, dated Apr. 18, 2018, w/ First Office Action Summary.

(Continued)

*Primary Examiner* — Nidhi Thaker
(74) *Attorney, Agent, or Firm* — Nixon Peabody LLP; Eduardo J. Quiñones

(57) ABSTRACT

A sled is provided to facilitate connection of the electrical components housed therein to a backplane located in a chassis. The sled includes a housing with a front portion and a rear portion connected by a base portion. The base portion includes a plurality of electronic unit modules. The sled also includes a connector laterally slidable with respect to the front portion of the housing. The connector is slidably configured to connect the electronic unit modules to a backplane located in the server rack.

16 Claims, 5 Drawing Sheets

(56) References Cited

U.S. PATENT DOCUMENTS

| | | | |
|---|---|---|---|
| 2003/0081386 A1* | 5/2003 | Robillard | H01R 13/6315 361/724 |
| 2008/0244052 A1* | 10/2008 | Bradicich | G06F 1/183 709/223 |
| 2010/0138581 A1 | 6/2010 | Bird et al. | |
| 2010/0265650 A1 | 10/2010 | Chen et al. | |
| 2013/0215563 A1 | 8/2013 | Behziz et al. | |
| 2014/0099806 A1* | 4/2014 | Ehlen | H01R 13/6315 439/121 |
| 2016/0165742 A1* | 6/2016 | Shen | H05K 7/1487 361/679.37 |

FOREIGN PATENT DOCUMENTS

| | | |
|---|---|---|
| TW | I535360 B | 5/2016 |
| WO | 2014073544 A1 | 5/2014 |

OTHER PUBLICATIONS

Taiwanese Search Report for Application No. 106121828, (report conducted Apr. 13, 2018) mailed with First Office Action dated Apr. 18, 2018.

Extended European Search Report for EP Application No. 17189760.6, dated Jun. 7, 2018.

JP Office Action for Application No. 2017-221440, dated Oct. 16, 2018, w/ First Office Action Summary.

* cited by examiner

SYMMETRICAL SLED BLIND MATING IN UNSYMMETRICAL CHASSIS PLACEMENT

FIELD OF THE INVENTION

The present invention relates generally to the coupling of a server sled with a server backplane and, more specifically, to the coupling of a server sled to a server backplane in a non-symmetrical chassis.

BACKGROUND

Conventional server chassis are designed so that server sleds (also commonly called server blades) are connected to a backplane or other server interconnect via connectors disposed in-line with the direction of insertion of the server sled into the server chassis. With this arrangement, the technician installing the server sled may apply force in a single direction to both insert the sled into the server chassis and couple the sled to the server chassis connector at the back of the server chassis and in line with the direction of the insertion force.

However, as server chassis are becoming denser, additional components are introduced into the server chassis that prevent in-line connection of the server sled into the server chassis. In some server chassis, power supply units or other components are oriented in such a way to prevent conventional server sleds from simple in-line connection. The addition of power supply units or other components creates an asymmetrical environment for the server sled. This can require multiple sled designs, thus increasing cost for manufacturing and servicing. Further, in many implementations, the technician building, maintaining, or modifying the computing system does not have a clear view of the connector on the backplane during the sled coupling process, and thus is required to attempt to couple the connector on the sled with the corresponding connector at the backplane without visual cues. This frequently leads to misalignment resulting in damage to the connectors or the sleds themselves.

SUMMARY

Embodiments of the invention concern a server rack system for efficiently coupling a server sled with a server backplane in a non-symmetrical chassis. A server rack system according to the various embodiments can include a sled insertable into the server rack system and a server. The sled can include a housing with a front portion and a rear portion connected by a base portion. The base portion includes a plurality of electronic unit modules. The server includes a backplane that has a plurality of slots, via which the plurality of electronic units modules on the sled are connected to the backplane. The server can also include a control module, a fan module, and a power supply module. The fan module is connected to the control module for dissipating heat generated by the plurality of electronic unit modules. Furthermore, the power supply module is connected to the control module, for powering the plurality of electronic unit modules. The sled includes a connector that is configured to slide laterally with respect to the front portion of the housing. The connector is also slidably configured to connect the electronic unit modules to the backplane.

In some embodiments of the invention, the connector is located on a slidable cage located at the front portion of the housing. Furthermore, in some embodiments of the invention, the slidable cage is guided to the backplane connector via at least one guide pin located on the server rack and at least one slot located at the slidable cage configured to receive the at least one guide pin. In some embodiments, the slidable cage is centrally restricted via at least one spring loaded mechanism. In alternative embodiments, the slidable cage is guided to the backplane connector via an alignment indicator on the slidable cage and the server rack. In some embodiments, the slidable cage is centrally restricted via a second guide pin located on the server rack and a second slot located at the slidable cage configured to receive the second guide pin.

In an exemplary embodiment of the apparatus, the server rack comprises a locking mechanism that indicates the sled is inserted in alignment with the backplane. In some embodiments, the plurality of electronic unit modules comprises a plurality of motherboards module. In an exemplary embodiment of the apparatus, the backplane comprises a plurality of slots, via which the plurality of electronic unit modules being respectively connected to the backplane.

DETAILED DESCRIPTION

Figure 1:
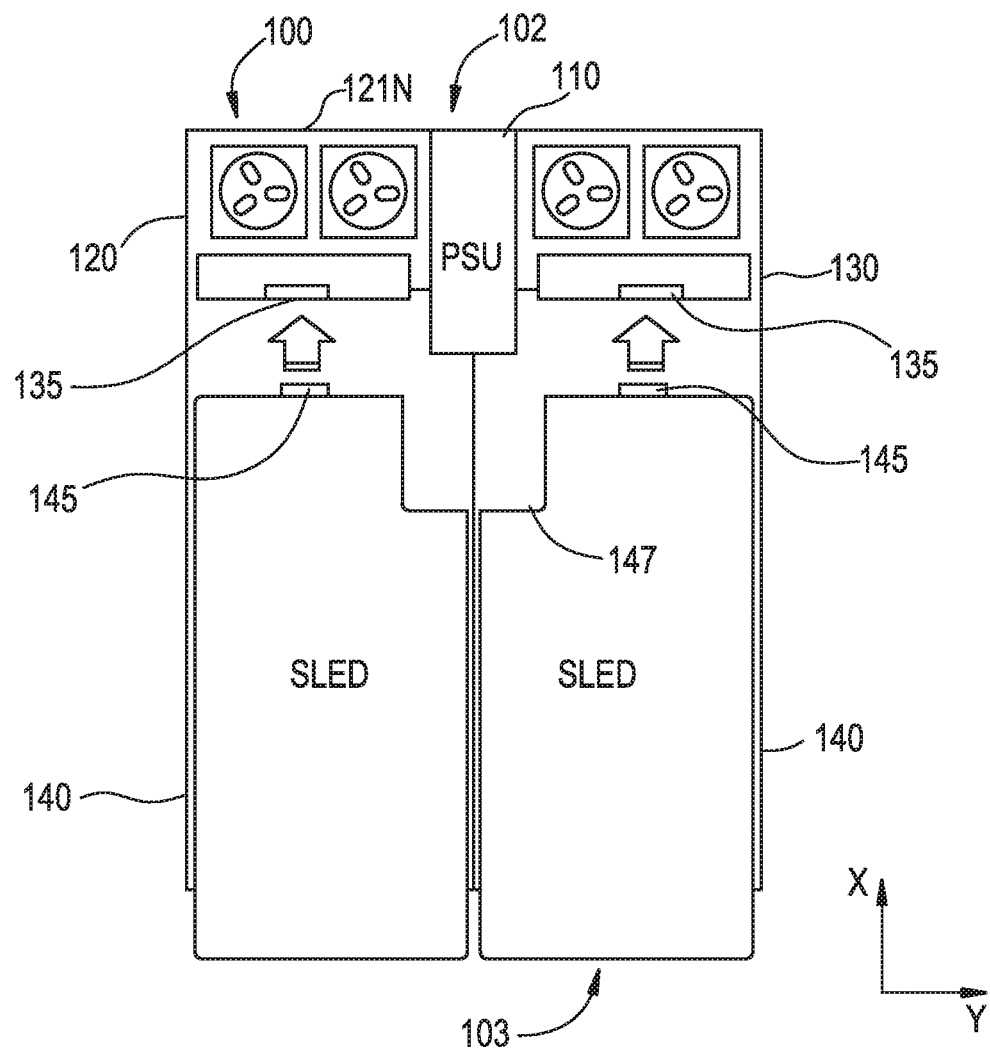
FIG. 1 is a top view of a server device with a server sled in accordance with traditional embodiments discussed herein.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In order to resolve the issue of high-density arrangement that prevents conventional server sleds from simple in-line connection, preferred embodiments of the present invention provide a server sled with a connector configured to slide laterally with respect to the server sled. In this disclosure, the connector is slidably configured to connect the electronic unit modules to the backplane.

FIG. 1 is a top view of a server device (e.g., chassis) 100 with a server sled in accordance with traditional embodiments discussed herein. In some embodiments, the server device 100 includes a plurality of fan modules 120, a plurality of power-supply modules 110, a backplane board 130, and server sleds 140, 141. The backplane board 130 is for connecting the server units stored on the server sleds 140, 141, the plurality of fan modules 120, the plurality of power-supply modules 110 and a control module (not shown). The plurality of fan modules 120 and the plurality of power-supply modules 110 are respectively controlled by the control module to dissipate heat generated by the server units stored on the server sleds 140,141 and power the server units. The server device 100 can include a front end 102 and a rear end 103. The server sleds 140, 141 can be inserted into the server device 100 from the rear end 103 and pushed in the direction of the front end 102. It should be realized that the server device 100 includes other components not mentioned herein. The components mentioned above are only for example, and not to limit this disclosure. The person having ordinary knowledge in the art may flexibly include other components in accordance with the invention.

The plurality of fan modules 120 in the server device 100 is arranged in parallel. In an embodiment of the invention, the plurality of fan modules 120 is disposed near the front end 102 of the server device to cool the electrical components housed therein via convection. The plurality of fan modules 120 is utilized to enhance the air convection across the server device 100 from the front end 102 to the rear end 103. The plurality of fan modules 120 can include four high-powered computer device fans 121N. Thus, the air flow generated by the fans 121N flows into and out of the server device 100 along an x-axis. This enables the plurality of fan modules 120 to maintain the server device 100 at the desired operating temperature. It should be realized that the quantities of the fans (e.g. four) mentioned above are only for example, and not to limit this disclosure. The person having ordinary knowledge in the art may flexibly select any proper quantity of fans in accordance with the disclosure.

The plurality of power-supply modules 110 is disposed in the server device 100, located at the front end 102 near the center. In this orientation, the plurality of power-supply modules 110 can restrict the server sled 140 from insertion, or require a novel redesign of the server sled 140 to account for the power supply modules 110. The plurality of power-supply modules 110 is electrically connected to the electrical components housed in the server device 100. The plurality of power-supply modules 110 can include a housing, a power control board, and power fans of the plurality of fan modules 120, and a host of other power related components (not shown). The power fans are utilized to provide air convection and to dissipate the heat in the power-supply housing. The power related components are disposed in the housing. This power related components can include, for example, a frequency booster, a frequency reducer, or a AC/DC converter and the like. It should be realized that the power-supply modules 110 includes other components not mentioned herein. The components mentioned above are only for example, and not to limit this disclosure. The person having ordinary knowledge in the art may flexibly include other components in accordance to the invention.

FIG. 1 also shows a schematic view of the server sleds 140, 141 inserted within the server device 100 in accordance with one embodiment of the present invention. In some embodiments, the server sleds 140, 141 can include a storage system, a control module to control access to information stored in the storage system and connectors 145, 146 being connected to backplane board 130 of the server device 100. It should be realized that the server device system design can be configured such that the server device 100 can receive a plurality of server sleds. For example, FIG. 1 provides a demonstrative of two server sleds 140, 141 inserted side by side as one layer of server sleds. However, the server device 100 may be configured to receive multiple layers of server sleds. The server device 100 and the server sleds 140, 141 have various standards and sizes. It should be noted that the configuration shown in FIG. 1 is illustrative of one embodiment. Other configurations, sizes or sled densities should be readily apparent to those skilled in the art. The server sleds 140, 141 also include connectors 145, 146 with an expansion slot interface and hot-swap support. The server sleds 140, 141 and the server device 100 are designed to support hot-swapping allowing failed drives or storage apparatus to be replaced with new drives without having to shut down the whole system. The server sleds 140, 141 supports a number of active elements including multiple storage devices, power supplies, control boards, boot devices, etc. The server sleds 140, 141 include an electrical connector for each of the sled-mounted active elements. The server sleds 140, 141 also include a system connector for electrically connecting the sled-mounted active elements with the system-wide active elements.

The connectors 145, 146 communicate to the backplane board 130 of the server device 100. The backplane board 130 is a system integration interface allowing the connectors 145, 146 to communicate with the server sleds 140, 141, respectively. In other words, the server device 100 is accessible to the server sleds 140, 141 via the backplane board 130, without of the use of any external lines or devices.

Referring to FIG. 1, because the plurality of power-supply modules 110 is disposed in the server device 100 at the front end 102 near the center, the power-supply modules 110 restrict the server sleds 140, 141 from insertion, or require a novel redesign of the server sleds 140, 141 to account for the power supply modules 110. In this case, the server sled 140 is customized to include an aperture 147 to account for the power-supply modules 110. Likewise, the server sled 141 is customized to include an aperture 148 to account for the power-supply modules 110. As a result, real estate that can otherwise be designated to storage modules, motherboard modules or processing modules on the server sleds 140, 141 are sacrificed due to the arrangement of electrical components within the server device 100. Additionally, the redesign and customizing of the server sleds 140, 141 can be an unnecessary expense in manufacturing and design. This is especially true considering the design of the server sled 140 vary from the design of the server sled 141.

Figure 2:
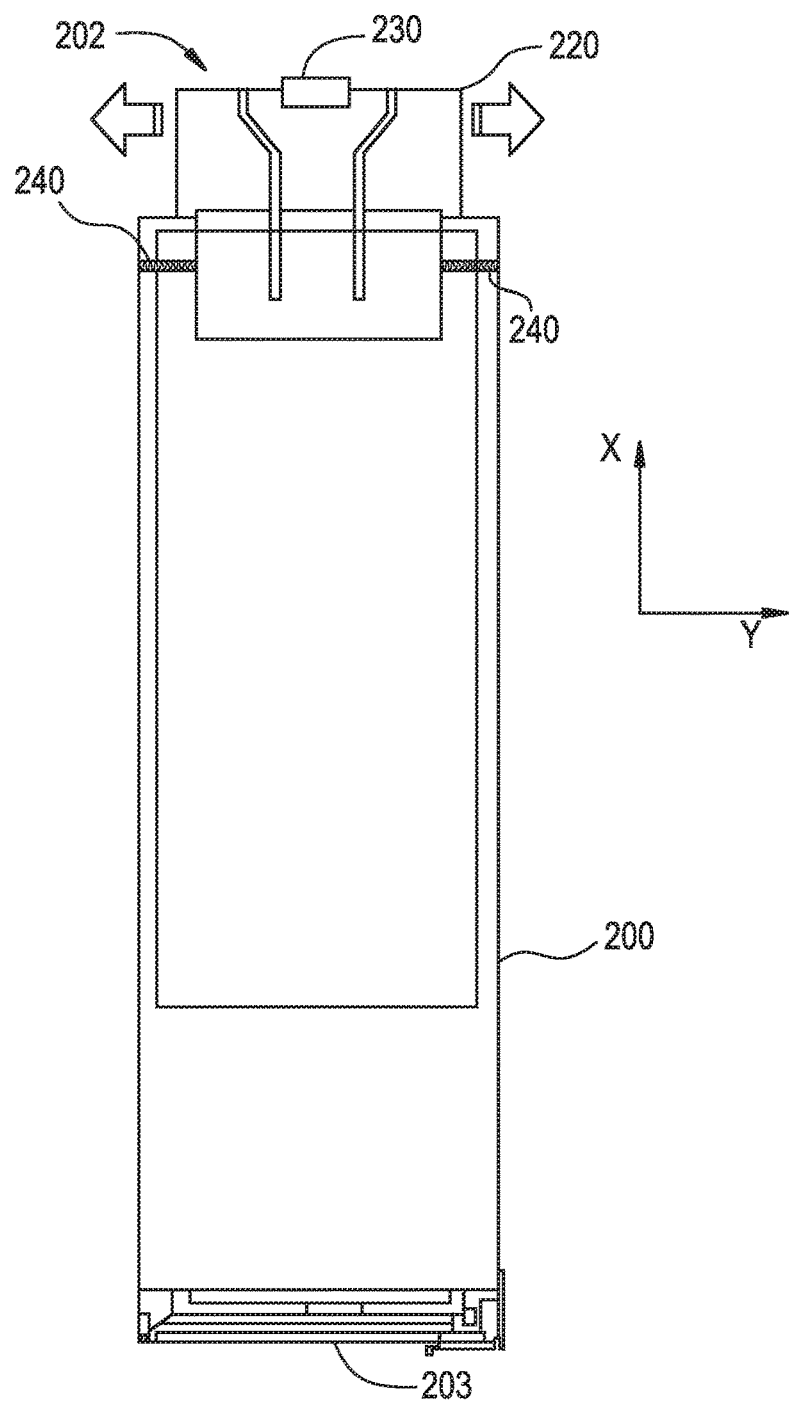
FIG. 2 is a top view of the exemplary server sled in accordance with embodiments of the disclosure.

In contrast, FIG. 2 shows one embodiment of a server sled 200 in accordance with embodiments of the disclosure, which enables efficient coupling of the server sled 200 with a backplane board 130 in a non-symmetrical chassis. In this embodiment, the server sled 200 is provided with a connector 230 configured to slide laterally with respect to the server sled 200. In this disclosure, the connector 230 is slidably configured to connect the electronic units stored on the server sled 200 to the backplane.

FIG. 2 depicts the server sled 200 removed from a server device. The server sled 200 includes a front end 202 and a rear end 203. The server sled 200 also includes a slidable structure 220 located at the front end 202 of the server sled 200. The slidable structure 220 houses a PCB connector 230 (sometimes referred to as a system connector) that is removably connectable to a backplane board electrical connector. The slidable structure 220 is configured to slide in the y-axis, or perpendicular to the direction of insertion of the server sled 200 into the server device. When the server sled 200 is removed then the PCB connector 230 is electrically disconnected from the backplane board electrical connector. This is discussed in detail with respect to FIG. 3.

The slidable structure 220 is spring loaded via spring mechanism 240 to remain centered with respect to the server sled 200. As is discussed in detail with respect to FIGS. 3, 4 and 5, the slidable structure 220 is configured to correctly position the PCB connector 230 relative to the backplane board electrical connector. The slidable structure 220 and its components can be made of sheet metal using conventional metal fabrication techniques such as bending, forming, and stamping. As a result, the slidable structure 220 can be made very inexpensively. Alternatively, the slidable structure 220 and its components can be made of aluminum alloy, steel alloy, or any combination thereof. It should be realized that the slidable structure 220 and its components can be made of any material constructed to withstand varying temperatures, and air flow of high velocity. The materials mentioned above are only for example, and not to limit this disclosure. A person having ordinary knowledge in the art may flexibly select any material in accordance with the disclosure.

Figure 3:
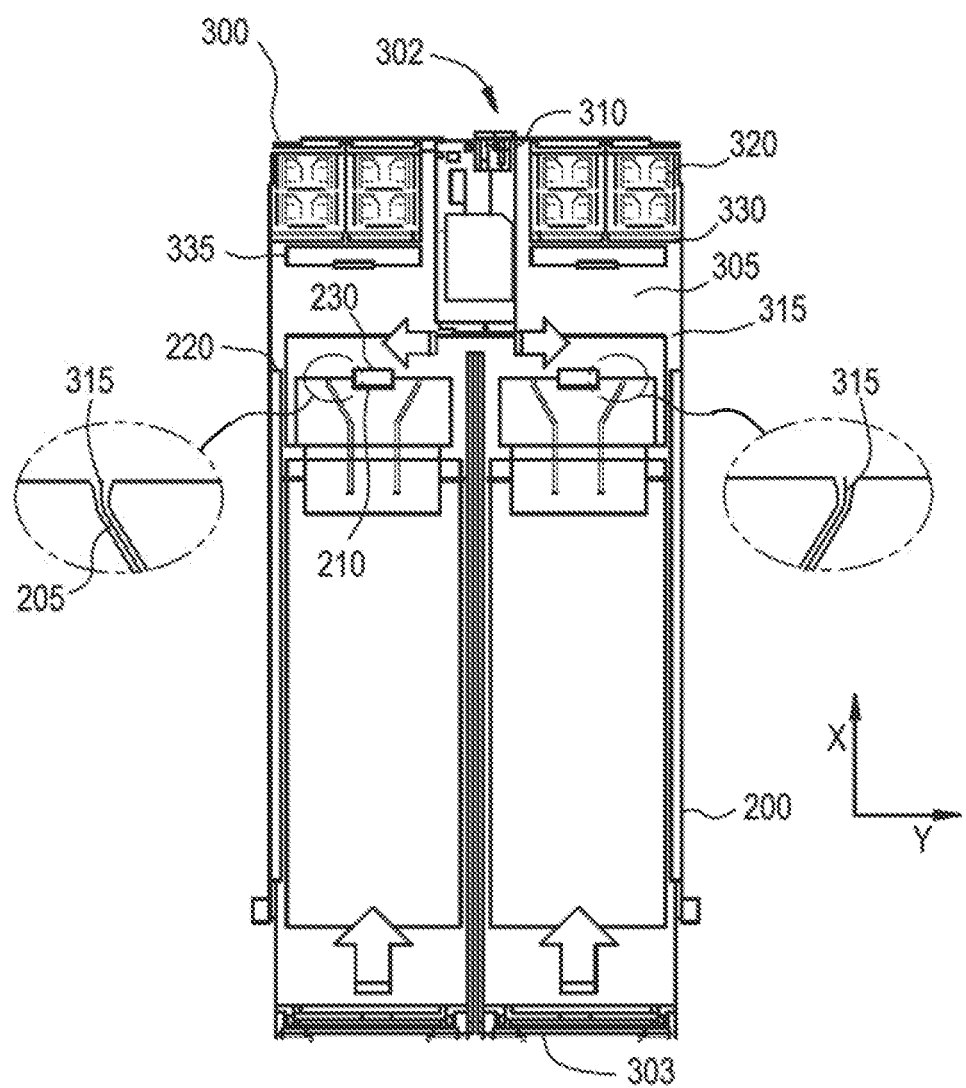
FIG. 3 is a top view of the exemplary server sled inserted into the server device in accordance to an embodiment of the disclosure.
Figure 4:
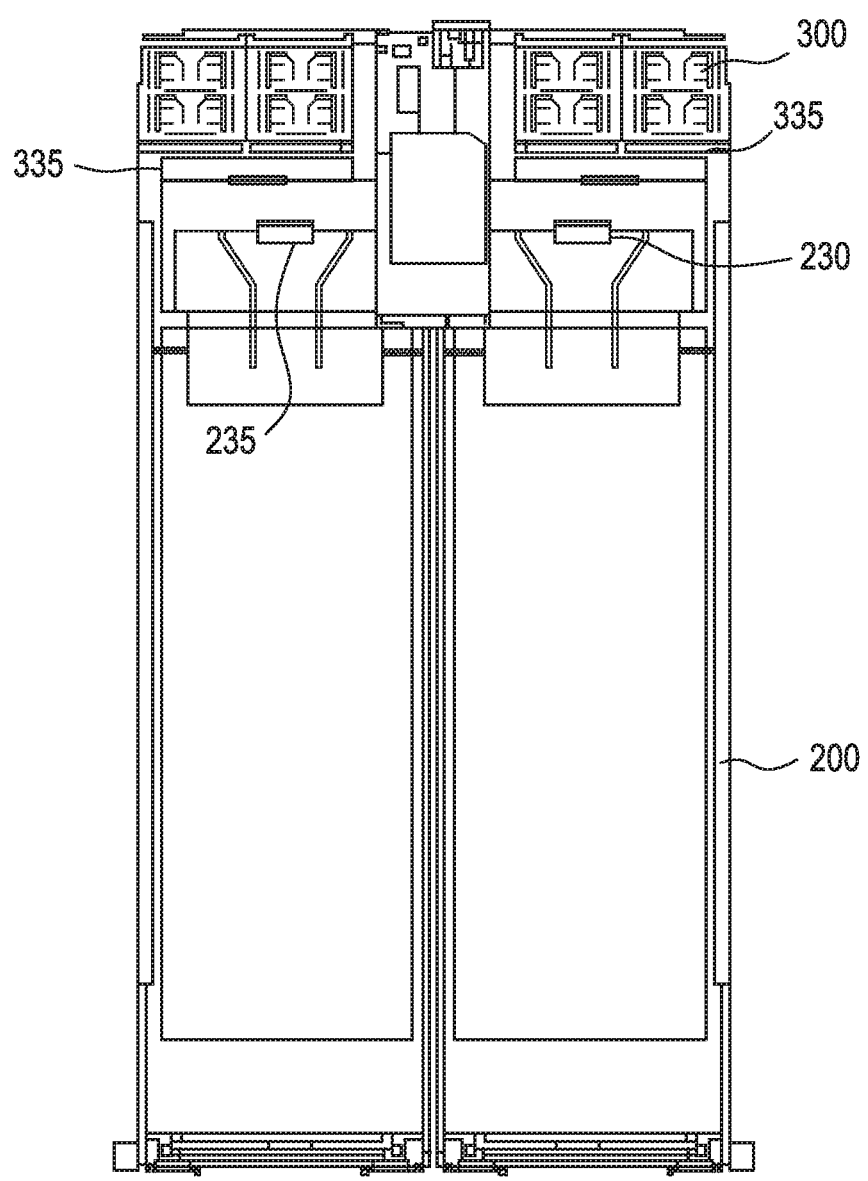
FIG. 4 is a top view of the exemplary server sled connected to the server device via the backplane in accordance to an embodiment of the disclosure.

FIG. 3 illustrates the server sled 200 in the loading position as it is being inserted into a server device 300 in accordance to an embodiment of the disclosure. FIG. 4 illustrates the server sled 200 in the locked position as it is connected and engaged with the server device 300. In some embodiments, the server device 300 includes a plurality of fan modules 320, a plurality of power-supply modules 310, a backplane board 330, and the server sled 200. The backplane board 330 is for connecting the server units stored on the server sled 200, the plurality of fan modules 320, the plurality of power-supply modules 310 and a control module (not shown). The backplane board 330 can include a backplane board electrical connector 335. The plurality of fan modules 320 and the plurality of power-supply modules 310 are respectively controlled by the control module to dissipate heat generated by the server units stored on the server sled 200 and power the server units. The server device 300 can include a front end 302 and a rear end 303. It should be noted, the server device 300 is similar to the server device 100. Therefore, the components of server device 300 are not described in great detail to avoid unnecessary repetition.

The server device 300 can include one or more guide pins 305, 315. The one or more guide pins 305, 315 are located on the server device just prior to the backplane board 330. The guide pins 305, 315 are strategically located to engage the slidable structure 220 as the server sled 200 is being inserted into the server device 300. In some embodiments, the location of the guide pins 305, 315 are based on the slidable structure 220 locked into its central position with respect to the server sled 200. The one or more guide pins 305, 315 can be configured to facilitate aligning the slidable structure 220 into position to couple the PCB connector 230 to the backplane board electrical connector 335 of the backplane board 330. The slidable structure 220 can include a plurality of slots 205 configured to receive the guide pins 305, 315 as the server sled 200 is being inserted into the server device 300. It should be realized that the server device 100 can include only one guide pin. In addition, it should be realized that the server device 300 can include more than two guide pins. The configuration described above is only for example, and not to limit this disclosure. The person having ordinary knowledge in the art may flexibly include one or more guide pins as the server device 300 and server sled 200 requires.

In the embodiments discussed, the slidable structure 220 contains a plurality of slots 205. However, it should be noted that the slidable structure 220 can include a single slot to receive a guide pin on the server device. A person having ordinary knowledge in the art may flexibly include other configurations of the slidable structure 220 as it pertains to aligning the PCB connector with the corresponding backplane board electrical connector.

In the loading position, the slidable structure 220 is maintained center with respect to the server sled 200 via spring mechanism 240. As a technician installing the server sled 200 applies force in the x-axis direction (e.g., in line with the direction of the insertion force) to both insert the server sled 200 into the server device 300 and couple the server sled 200 to the PCB connector 230, the plurality of slots 205 located on the slidable structure 220 engages the guide pins 305, 315 on the server device 300.

The plurality of slots 205 are designed such that the slidable structure 220 guides the PCB connector 230 to the backplane board electrical connector 335 of the backplane board 330. This is the case regardless of whether the server sled 200 is inserted to the left or right of the plurality of power-supply modules 310. For example, where the server sled 200 is inserted to the right of the plurality of power-supply modules 310, the slidable structure 220 engages the guide pins 305, 315 on the server device 300 to shift the PCB connector 230 to the right and align with the backplane board electrical connector 335 of the backplane board 330. Similarly, where the server sled 200 is inserted to the left of the plurality of power-supply modules 310, the slidable structure 220 engages the guide pins 305, 315 on the server device 300 to shift the PCB connector 230 to the left and align with the backplane board electrical connector 335 of the backplane board 330. The slidable structure 220 is configured to slide in the y-axis, or perpendicular to the direction of insertion of the server sled 200 into the server device. When the server sled 200 is removed then the PCB connector 230 is electrically disconnected from the backplane board electrical connector 335.

Figure 5:
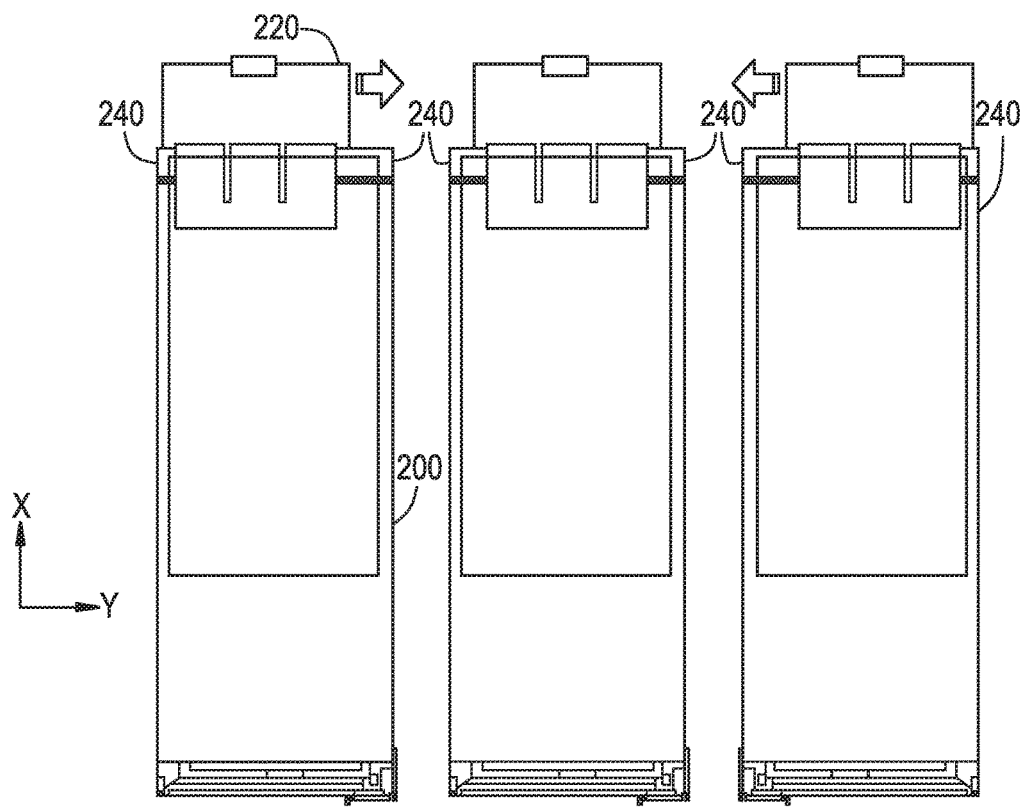
FIG. 5 is a top view of an exemplary server sled once deployed from the server device in accordance with embodiments of the disclosure.

FIG. 5 illustrates the server sled 200 once deployed from the server device 300 in accordance to an embodiment of the disclosure. As discussed above, the slidable structure 220 is spring loaded via spring mechanism 240 to remain centered with respect to the server sled 200. In addition, a locking mechanism can be implemented to indicate to the technician that the slidable structure 220 is in-fact aligned with the backplane board electrical connector 335.

Figure 6:
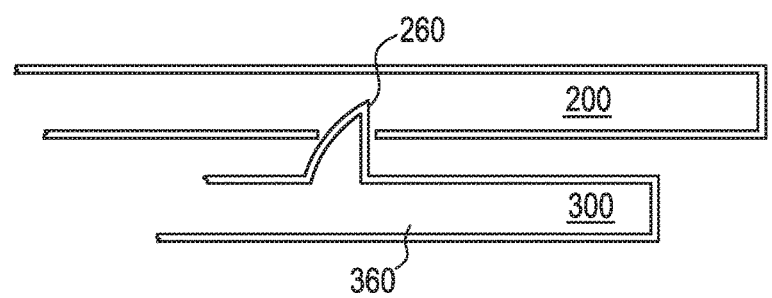
FIG. 6 illustrates an exemplary locking element located on the server sled and a corresponding locking element located on the server device.

FIG. 6 illustrates an exemplary locking element 260 located on the server sled 200 and the corresponding locking element 360 located on the server device 300. Both locking elements 260, 360 are arranged so that once the slidable structure 220 engages the guide pins 305, 315 on the server device 300 to shift the PCB connector 230 to align with the backplane board electrical connector 335: (1) the locking elements 260 and 360 engage with each other to prevent motion of the slidable structure 220 (in either direction) and (2) the PCB connector 230 engages with a corresponding backplane board electrical connector 335 so as to connect the server units stored on the server sled 200 with the other components in the server device 300. It should be realized that the slidable structure 220 and its components can implement any other types of mechanical features to restrict it to its centered position. For example, a second plurality of slots on the slidable structure 220 can be implemented to receive a second guide pins on the server device such that the slidable structure 220 is initially aligned once the server sled 200 is inserted into the server device.

In the embodiments discussed, the slidable structure 220 is spring loaded center with respect to the server sled 200. However, it should be noted that the slidable structure 220 can be manually locked to the left or right prior to the insertion of the server sled 200 into the server device 300. One or more guide pins can be implemented to guide the PCB connector 230 engages with a corresponding backplane board electrical connector 335. In an alternative embodiment, the one or more guide pins can be implemented to secure the PCB connector 230 with a corresponding backplane board electrical connector 335 as the initial placement of the slidable structure 220 can align the PCB connector 230 with the corresponding backplane board electrical connector 335. A person having ordinary knowledge in the art may flexibly include other configurations of the slidable structure 220 as it pertains to aligning the PCB connector 230 with the corresponding backplane board electrical connector 335.

In the embodiments discussed, the slidable structure 220 contains a single PCB connector 230 to connect the server sled 200 to the backplane board electrical connector 335. However, it should be noted that the slidable structure 220 can include multiple PCB connectors such that the slidable structure 220 does not need to travel a considerable distance to align one of the PCB connectors with the corresponding backplane board electrical connector 335. In addition, including multiple PCB connectors can further insure that a PCB connector is aligned with the corresponding backplane board electrical connector regardless of orientation of the internal components of the server device 300.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A sled insertable into a server, comprising: a first connector, wherein the server comprises a backplane comprising a plurality of slots, via which a plurality of electronic units modules are connected to the backplane, the backplane comprising a first backplane connector and a second first backplane connector; a control module; a fan module, connected to the control module, for dissipating heat generated by the plurality of electronic unit modules; and a power supply module, connected to the control module, for powering the plurality of electronic unit modules, the power supply module disposed in a center region of either a front side or a backside of the server; wherein the first connector is configured to connect the sled to the first backplane connector, wherein, while the sled is inserted into a left half of the server, the first connector is slid to the left of the sled by a first guiding structure prior to being connected to the first backplane connector of the backplane, and a slidable cage on the sled is guided to the first backplane connector via at least one guide pin located on the server and at least one slot located at the slidable cage configured to receive the at least one guide pin.

2. The sled insertable into a server of claim 1, wherein the first connector is located on the slidable cage located at a front portion of the sled.

3. The sled insertable into a server of claim 2, wherein the slidable cage is centrally restricted via at least one spring loaded mechanism.

4. The sled insertable into a server of claim 2, wherein the slidable cage is guided to the first backplane connector via an alignment indicator on the slidable cage and the server.

5. The sled insertable into a server of claim 2, wherein the slidable cage is centrally restricted via a second guide pin located on the server and a second slot located at the slidable cage configured to receive the second guide pin.

6. The sled insertable into a server of claim 1, wherein the server comprises a locking mechanism that indicates the sled is inserted in alignment with the backplane.

7. The sled insertable into a server of claim 1, wherein the plurality of electronic unit modules comprises a plurality of motherboard modules.

8. The sled insertable into a server of claim 1, wherein the backplane comprises a plurality of slots, via which the plurality of electronic unit modules being respectively connected to the backplane.

9. A server, comprising: a backplane, comprising a plurality of slots, via which a plurality of electronic unit modules are connected to the backplane, the backplane comprising a first backplane connector and a second first backplane connector; a control module; a fan module, connected to the control module, for dissipating heat generated by the plurality of electronic unit modules; a power supply module, connected to the control module, for powering the plurality of electronic unit modules, the power supply module disposed in a center region of either a front side or a backside of the sever; and a first server sled and a second server sled, the first server sled disposed at a left half of the server, the second server sled disposed at a right half of the server, wherein the first server sled comprises a first connector, the first connector configured to connect the first server sled to the first backplane connector, wherein, while the first server sled is inserted into the left half of the server, the first connector is slid to a left of the first server sled by a first guiding structure prior to being connected to the first backplane connector of the backplane, and a slidable cage on the first server sled is guided to the first backplane connector via at least one guide pin located on the server and at least one slot located at the slidable cage configured to receive the at least one guide pin.

10. The server rack system of claim 9, wherein the first connector is located on the slidable cage located at a front portion of the first server sled.

11. The server rack system of claim 10, wherein the slidable cage is centrally restricted via at least one spring loaded mechanism.

12. The server rack system of claim 10, wherein the slidable cage is guided to the backplane connector via an alignment indicator on the slidable cage and the server.

13. The server rack system of claim 10, wherein the slidable cage is centrally restricted via a second guide pin located on the server and a second slot located at the slidable cage configured to receive the second guide pin.

14. The server rack system of claim 9, wherein the server rack comprises a locking mechanism that indicates the first server sled is inserted in alignment with the backplane.

15. The server rack system of claim 9, wherein the plurality of electronic unit modules comprises a plurality of motherboards module.

16. The server rack system of claim 9, wherein the backplane comprises the plurality of slots, via which the plurality of electronic unit modules being respectively connected to the backplane.

* * * * *